United States Patent [19]

Gorzel et al.

[11] Patent Number: 4,586,003

[45] Date of Patent: Apr. 29, 1986

[54] ON-OFF RAPIDLY SWITCHABLE AMPLIFIER CIRCUIT WITH D-C FEEDBACK

[75] Inventors: Heribert Gorzel; Wolfgang Liess, both of Berlin, Fed. Rep. of Germany

[73] Assignee: Robert Bosch GmbH, Stuttgart, Fed. Rep. of Germany

[21] Appl. No.: 697,737

[22] Filed: Feb. 4, 1985

[30] Foreign Application Priority Data

Feb. 10, 1984 [DE] Fed. Rep. of Germany ....... 3404719

[51] Int. Cl.$^4$ .............................................. H03F 1/00
[52] U.S. Cl. .................................... 330/297; 330/261; 330/290; 330/296
[58] Field of Search ............... 330/259, 261, 290, 296, 330/297, 202-204

[56] References Cited

U.S. PATENT DOCUMENTS 4,491,802 1/1985 Uchida et al. .................. 330/261 X

OTHER PUBLICATIONS

"Inegrierte Schaltungen fur Industrielle Anwendunge" (Siemens, Integrated Circuits for Industrial Applications, 1982/83, pp. 177-184).

Primary Examiner—James B. Mullins
Attorney, Agent, or Firm—Frishauf, Holtz, Goodman & Woodward

[57] ABSTRACT

To provide for essentially instantaneous stable operation of an electrical circuit, including an internal R/C feedback circuit, upon connection to an interruptible power supply source ($+U_S$, G), the circuit includes an additional or auxiliary input terminal (14) which is connected to a series-capacitor network, including a series capacitor (C1, 19) serially connected between the additional terminal (14) and a power terminal of the power supply, and a shunt capacitor (C2, 18) connected between the additional terminal (14) and ground or chassis of the power supply; and wherein the capacity value relationships of the series and shunt capacitors are so selected with respect to the voltage of the power supply that the additional terminal will have a voltage corresponding to at least approximately the operating point ($U_V$) impressed thereon upon connection of the power supply means.

4 Claims, 1 Drawing Figure

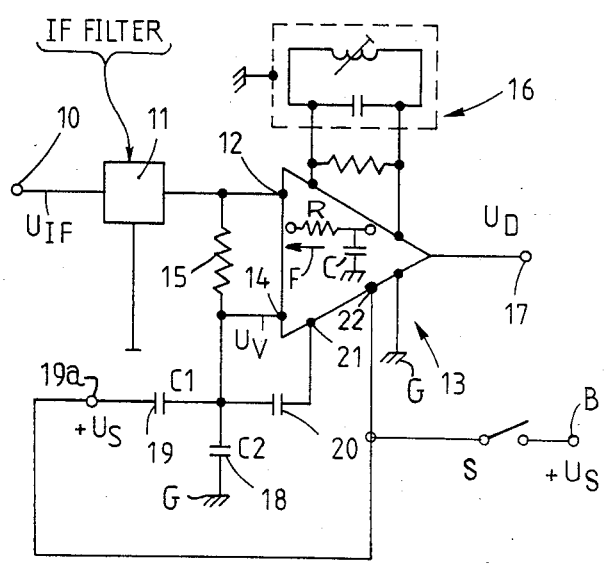

ON-OFF RAPIDLY SWITCHABLE AMPLIFIER CIRCUIT WITH D-C FEEDBACK

The present invention relates to a circuit, and particularly to an amplifier circuit, which has a d-c feedback circuit therein in order to set the operating point of the circuit at a stable level.

BACKGROUND OF THE INVENTION

Amplifiers with d-c coupling are well known—see, for example, Siemens, "Integrierte Schaltungen für industrielle Anwendungen", 1982/83 (Siemens, "Integrated Circuits for Industrial Applications", 1982/83, pp. 177–184). Such circuits include an internal d-c feedback connection which utilizes an external capacitor for high-frequency blocking at the terminal which sets the operating point of the amplifier. It has been found that the time constant of an R/C element which is part of the feedback circuit is too long for various applications of the amplfier. For example, if the amplifier is to be used with a battery-operated radio unit, in which the d-c supply is switched in a predetermined rhythm, turn-ON of the d-c supply upon switching causes the amplifier to reach its operating point only after elapse of a finite period of time during which transients may occur, and/or are eliminated. This turn-ON time, reflected as a delay, reduces the effectively available reception period of time for the radio apparatus, and thus unnecessary use of electrical energy before the actual radio function of the apparatus can be used as such. A separate power supply can be provided for the microprocessor, which is not switched ON/OFF in the rhythm, since the microprocessor as such uses very little electrical energy, and thus supply from a battery thereof is entirely feasible.

SUMMARY OF THE INVENTION

It is an object to provide a d-c feedback coupled amplifier which reaches its operating point rapidly, so that the battery capacity, and thus the battery supply energy utilization, is improved. The circuit is particularly suitable for portable equipment operated, for example, by dry cells.

Briefly, a signal input receives a signal, for example an intermediate frequency (IF) signal, to be processed. An internal d-c feedback circuit including a resistive element and a capacitative element (R/C) is provided to stabilize the operating point of the circuit. The power supply to the circuit is interruptible, so that operating voltage to the circuit is not supplied continuously but, for example, in a predetermined rhythm, operated by a switch.

In accordance with the present invention, an auxiliary power supply input is provided, connected for rapid processing of signals including an additional terminal coupled to the feedback circuit, and hence having a signal thereat representative of the operating point of the circuit; and a capacitative network is provided which includes a series capacitor, serially connected between the additional terminal and a power terminal of the power supply, in combination with an additional shunt capacitor connected between the additional terminal and ground or chassis terminal of the power supply. In accordance with a feature of the invention, the relationship between the capacity values of the series capacitor and the shunt capacitor is so selected with respect to the voltage of the power supply that the additional terminal will have impressed thereon—upon connection of the power supply—a voltage which approximately corresponds to the operating point of the circuit, preferably an amplifier.

The circuit has the advantage that, in spite of the feedback circuit, the operating point of the amplifier will be reached rapidly, thereby improving utilization of a battery supplying power to the circuit, typically an amplifier.

BRIEF DESCRIPTION OF THE DRAWING

The single FIGURE is a schematic circuit diagram of the system in accordance with the present invention.

DESCRIPTION OF THE PREFERRED EMBODIMENT

The FIGURE is a portion of an IF circuit of a radio apparatus. A terminal 10 receiving an IF voltage $U_{IF}$ is connected over an IF filter 11 with a first input 12 of an IF amplifier 13. The IF amplifier 13, which can be formed as an integrated circuit, for example an operational amplifier, has an internal feedback circuit, shown, schematically, within the element 13 as a resistor R and a capacitor C. Since this is a negative feedback circuit, an arrow F is included in the circuit 13 and pointing towards the input.

The amplifier 13 has a second terminal 14 carried out from the internal circuitry thereof, forming a second input terminal, which receives biassing potential $U_V$. A resistor 15 is connected between the IF input terminal 12 and the auxiliary input terminal 14. A discriminator 16 is provided, shown only schematically, and, if desired, externally connected to the amplifier, although it may form a part thereof. The amplifier 13 has an output terminal 17 at which an output signal $U_D$ is available.

The second input 14 of the amplifier is coupled over a first capacitor C1, 19 to a source of switched voltage supply $U_S$, and over a second capacitor C2, 18 to a ground or chassis terminal G, which forms the second terminal of the voltage supply source $U_S$. The voltage supply $U_S$ is switched from a battery at terminal B, supplying positive voltage $U_S$ through a switch S, and connected to the terminal 19a to which the capacitor C1 is serially connected. A third capacitor 20 is connected to a terminal 21 of the amplifier and to a junction which also includes the auxiliary input terminal 14. A power supply terminal 22 on the amplifier 13 is connected to the switched voltage supply B.

Operation: The time constant due to the internal R/C feedback network causes a delay between stable operation of the amplifier and connection of voltage upon closing of the switch S. This time delay should be as short as possible and, in accordance with the invention, the values of the capacities of the capacitors C1, C2 of the capacitors 19, 18 are so selected that, by instantaneous charging of the capacitors, the voltage $U_S$ is applied to the auxiliary input 14 of the amplifier 13 almost without delay. Thus, a pulse-like voltage $U_S$ is applied to the auxiliary terminal 14 of the amplifier 13 to set its working or operating point at the operating voltage $U_V$.

The modulated intermediate frequency (IF) voltage $U_{IF}$ thus can be amplified by the amplifier 13 immediately upon connection of the switch S, that is, connection of the voltage $U_S$, so that the IF voltage can be instantaneously demodulated.

When the switch S opens, the capacitors 18, 19 can discharge, so that, upon subsequent reclosing of the switch S, they will be discharged, to apply, instantaneously, the voltage $U_V$ to the auxiliary terminal 14.

Various changes and modifications may be made, and the invention is not limited to the IF amplifier selected as an example. The invention can be used with the same advantage in connection with other amplifiers, for example also in comparators, or in other circuits in which the working point will not become stable immediately upon connection of a power source, but is subject to a brief period of transient response during which no meaningful output is available.

A suitable IF frequency for the receiver is: 455 kc. For a battery supply voltage $U_S$ of 4 V, capacitors C1, 19 and C2, 18 of 22 nF and 47 nF are suitable. Circuit 13, for example, can be: TBB 1469 (Siemens). With this configuration, the voltage at the auxiliary terminal 14 is: appr. 1.3 V. The time delay of supplying the voltage $U_V$ of appr. 1.3 V to terminal 14 upon connection of the switch S is: $\leq 5$ ms (without C1 $\geq 30$ ms).

A suitable internal R/C feedback circuit has the following values: Resistance R=180 k$\Omega$, internal capacitor C negligible.

We claim:

1. Rapidly power-ON switchable electrical circuit (13), particularly for repeated ON/OFF switching between ON and OFF connection of a power supply to the circuit, having a signal input terminal (12) receiving a signal ($U_{IF}$) to be processed;

an internal d-c feedback circuit (R/C) to stabilize the operating point ($U_V$) of the circuit (13);

interruptable power supply means ($U_S$, G, S) connected for supplying operating voltage to the circuit adapted to be repeatedly switched ON and OFF, and comprising a circuit arrangement to rapidly determine the operating point of the electrical circuit (13) and reduce the time of transient operation of the circuit upon having power connected thereto when the power supply means is switched ON, including an additional terminal (14) coupled to the feedback circuit and hence to the signal thereat representative of the operating point ($U_V$) of the circuit; and an additional auxiliary power supply coupled to the additional terminal, said additional auxiliary power supply comprising a capacitor network (18, 19) having a series capacitor (19, C1) serially connected between the additional terminal (14) and a power terminal of the power supply means, and a shunt capacitor (18, C2) connected between the additional terminal (14) and a ground or chassis terminal of the power supply means, and wherein the relationship between the capacity value of the series capacitor and the capacity value of the shunt capacitor is selected with respect to the voltage of the power supply means ($U_S$-G) to apply instantaneously, upon connection of the power supply means, to said additional terminal a voltage corresponding substantially to the operating point ($U_V$).

2. Circuit according to claim 1, wherein the circuit (13) comprises an amplifier.

3. Circuit according to claim 1, wherein the circuit comprises an operational amplifier (13).

4. Circuit according to claim 2, wherein the signal is an intermediate frequency radio signal.

* * * * *